US009515205B2

(12) United States Patent
Pernel et al.

(10) Patent No.: US 9,515,205 B2
(45) Date of Patent: Dec. 6, 2016

(54) METHOD FOR METALLIZING TEXTURED SURFACES

(75) Inventors: Carole Pernel, St Egreve (FR); Nicolas Chaix, Saint Martin d'Uriage (FR); Stefan Landis, Voiron (FR)

(73) Assignee: COMMISSARIAT A L'ENERGIE ATOMIQUE AUX ENERGIES ALTERNATIVES, Paris (FR)

( * ) Notice: Subject to any disclaimer, the term of this patent is extended or adjusted under 35 U.S.C. 154(b) by 408 days.

(21) Appl. No.: 14/002,854

(22) PCT Filed: Mar. 5, 2012

(86) PCT No.: PCT/EP2012/053760
§ 371 (c)(1),
(2), (4) Date: Oct. 3, 2013

(87) PCT Pub. No.: WO2012/119990
PCT Pub. Date: Sep. 13, 2012

(65) Prior Publication Data
US 2014/0034125 A1    Feb. 6, 2014

(30) Foreign Application Priority Data

Mar. 4, 2011 (FR) ..................... 11 51755

(51) Int. Cl.
*H01L 31/0236* (2006.01)
*H01L 31/0224* (2006.01)
(Continued)

(52) U.S. Cl.
CPC ... *H01L 31/02366* (2013.01); *H01L 31/02363* (2013.01); *H01L 31/022425* (2013.01);
(Continued)

(58) Field of Classification Search
CPC ............ H01L 31/02366; H01L 31/18; H01L 31/0747; H01L 31/022425; H01L 31/02363; H01L 21/2885; H01L 21/0338; H01L 21/0337; H01L 31/03762; Y02E 10/50
See application file for complete search history.

(56) References Cited

U.S. PATENT DOCUMENTS 6,475,369 B1 * 11/2002 Cohen ................. B81C 1/00126
205/118
7,235,474 B1    6/2007 Dakshina-Murthy et al.
(Continued)

FOREIGN PATENT DOCUMENTS

EP    0 735 597 A2    10/1996
EP    2 068 373       6/2009
(Continued)

OTHER PUBLICATIONS

S.M. Sze: "Semiconductor Devices", Physics and Technology, Bell Telephone Laboratories, XP-002683641, Dec. 31, 1985, 3 pages.
(Continued)

*Primary Examiner* — Michelle Mandala
(74) *Attorney, Agent, or Firm* — Oblon, McClelland, Maier & Neustadt, L.L.P.

(57) ABSTRACT

A method for creating electrically conducting or semiconducting patterns on a textured surface including plural reliefs of amplitude greater than or equal to 100 nanometers, including: preparing a substrate during which at least the textured surface of the substrate is made electrically conducting; coating during which at least one layer of an imprintable material is laid on the textured surface, made electrically conducting, of the substrate; pressing a mold including valleys or protrusions to transfer the valleys or the protrusions of the mold into the imprintable material to form patterns therein; removing the mold while leaving the imprint of the patterns in the imprintable material; exposing the textured surface, made electrically conducting, of the
(Continued)

substrate, at a bottom of the patterns; and electrically depositing an electrically conducting or semiconducting material into the patterns to form conducting or semiconducting patterns.

22 Claims, 5 Drawing Sheets

(51) Int. Cl.
*H01L 31/0747* (2012.01)
*H01L 31/18* (2006.01)
*H01L 21/033* (2006.01)
*H01L 21/288* (2006.01)
*H01L 31/0376* (2006.01)

(52) U.S. Cl.
CPC .......... *H01L 31/0747* (2013.01); *H01L 31/18* (2013.01); *H01L 21/0337* (2013.01); *H01L 21/0338* (2013.01); *H01L 21/2885* (2013.01); *H01L 31/03762* (2013.01); *Y02E 10/50* (2013.01)

(56) References Cited

U.S. PATENT DOCUMENTS

| | | | | |
|---|---|---|---|---|
| 7,435,074 | B2* | 10/2008 | Colburn | B82Y 10/00 216/72 |
| 8,980,656 | B2* | 3/2015 | Li | B82Y 10/00 257/E33.005 |
| 2002/0132482 | A1* | 9/2002 | Chou | B29C 43/003 438/692 |
| 2007/0036951 | A1* | 2/2007 | Nguyen | C23C 18/1608 428/209 |
| 2007/0283883 | A1 | 12/2007 | Dakshina-Murthy et al. | |
| 2010/0006147 | A1 | 1/2010 | Nakashima et al. | |
| 2010/0247970 | A1* | 9/2010 | Omatsu | G11B 5/743 428/836 |

FOREIGN PATENT DOCUMENTS

| | | |
|---|---|---|
| JP | 8-330611 | 12/1996 |
| JP | 2000-58885 | 2/2000 |
| JP | 2000-223443 | 8/2000 |
| JP | 2009-21541 | 1/2009 |
| JP | 2010-10708 | 1/2010 |
| JP | 2010-18666 | 1/2010 |
| JP | 2010-262980 | 11/2010 |

OTHER PUBLICATIONS

Jager, K. et al., "Light scattering properties of surface-textured substrates", Physica Status Solidi. C: Current topics in solid State Physics, vol. 7, No. 3-4, pp. 945-948, XP009162833,(Apr. 1, 2010).
Chopra & Das: "Tin film solar cells", Plenum Press, London, pp. 261-264, XP002668244, (Dec. 31, 1983).
Coutts & Meakin: "Current topics in photovoltaics", Academic Press, London, pp. 156-158, XP002668243, (Dec. 31, 1985).
International Search Report Issued Oct. 8, 2012 in PCT/EP12/053760 Filed Mar. 5, 2012.
Office Action issued Jan. 4, 2016 in Japanese Patent Application No. 2013-555903 (with English translation).

* cited by examiner

METHOD FOR METALLIZING TEXTURED SURFACES

The present invention generally relates to the production of electrically conducting or semiconducting patterns on a semiconducting or conducting device having reliefs or high texturing. A preferred application of the invention is the metallization of photovoltaic cells.

Semiconducting devices of the integrated circuits type are traditionally industrially manufactured on the surface of thin slices of a semiconducting material, usually silicon, one of the faces of which has received an optics-qualified finish (mirror finish), more particularly to allow the best possible implementation of the techniques used to define the sizes and shapes of the components composing these circuits in an increasingly precise manner thanks to ever-increasing levels of integration.

However, for some of the devices produced by the microelectronics industry, it can sometimes be very advantageous to make these on the surface of substrates having a significant relief or high texturing. This is particularly the case for optoelectronic devices such as light-emitting diodes or photovoltaic cells where surface texturing provides much better optoelectronic characteristics.

A standard method used for the industrial production of photovoltaic cells uses, for example, single-crystal or polycrystalline silicon. A N- or P-type doped substrate must first undergo texturing of the surface with a solution of potassium hydroxide. The resulting surface has a pyramidal structure of micrometric size, in order to reduce its reflectivity, to increase the surface exposed to incoming beams and make it possible to obtain a better optical confinement of the incoming beams in the substrate.

In this type of method for producing low-cost devices, the final metallizations used for the interconnections are additionally executed after the formation of all the layers forming a device, by screen printing, i.e. using a stencil, and a usually silver-based metal paste.

Because of the reliefs of the textured surface, it often happens that, when screen printing with the silver paste, the latter is loose on the textured substrate surface. The contact between the silver paste and the substrate may then be interrupted in some places. The electrical contact is then unsatisfactory.

Now, the device performance is highly dependent on the quality of the electrical contact between the metallization and the textured substrate.

Solutions were found to try and remedy this problem. Thus, solutions provide a step of annealing in an oven to improve the contact. The annealing conditions, more particularly the temperature thereof, are critical to the quality of the electrical contact obtained. These solutions are not always easily implemented. In particular, the choice of the optimal annealing temperature may be limited in practice by the presence of brittle materials used for manufacturing these devices. For example, in the case of so-called heterojunction photovoltaic cells, a layer of amorphous silicon is present in order to obtain better optoelectronic characteristics by limiting the recombination of the carriers. However the metallizations must then be annealed at a so-called low temperature, i.e. less than about 400° C. This annealing, which is necessary to have the metal penetrate into the silicon structure, also involves the utilization of specific screen printing pastes that are not without drawbacks, including: a higher electrical resistance and reduced adhesion to silicon due to the presence of many additives.

A need therefore exists for providing a solution to improve the electrical contact between the lines and the substrate and to limit the need to use materials having a high electrical resistance or a poor adhesion to the substrate.

To this end, the invention provides for a method for creating metallic patterns on a textured surface of a semiconducting device, with the textured surface comprising a plurality of reliefs, such as interconnections, the amplitude of which ranges from once to one-tenth times the amplitude of the pattern width, characterized in that it comprises the following steps:

a step of preparing a substrate during which at least the textured surface of the substrate is made electrically conducting;

a step of preparing during which a layer of an imprintable material is plated onto the electrically conducting layer;

a step of pressing a mold comprising valleys or protrusions so as to transfer the valleys or the protrusions of the mold into the imprintable material in order to form patterns to be metallized therein;

a step of removing the mold while leaving the imprint of the patterns to be metallized in the imprintable material;

a step of electrodeposition or electrochemical deposition of at least one electrically conducting or semiconducting material into the patterns to form electricity conducting or semiconducting patterns. For example, the electricity conducting or semiconducting material is a metal, and the patterns are metallic patterns.

Within the development of the present invention, the method according to the invention proved to be able to significantly improve the quality of the contact between the metal lines and the substrate and this without damaging the texture of the substrate, which was expected when using an imprinting method.

The device performance is therefore improved.

In addition, and particularly advantageously, the method according to the invention can produce much narrower patterns than with the known screen printing technique. The surface occupied by these patterns can thus be reduced. This results in a reduction in the shadowing of the substrate and a better exposure of the latter to the luminous flux. The performance of the optoelectronic devices such as photovoltaic panels is thus substantially increased.

Finally, the method according to the invention can produce patterns with various metals. Unlike known screen printing techniques which are mainly limited to the use of silver paste, the invention allows patterns to be provided in more conducting materials such as copper, for example.

The invention thus allows on the one hand improving the quality of the contact between the metal patterns and the substrate and on the other hand reducing the shadowing of the latter without having to use materials having a high electrical resistance.

The achieved performances of the devices of the invention are thus significantly improved.

Optionally, the method according to the invention further comprises at least any one of the following optional characteristics:

The reliefs of the textured surface have amplitude greater than one-tenth times the minimum width of said patterns along a direction parallel to the mean plane of the substrate. Most often, the reliefs of the textured surface have amplitude ranging from one-tenth to a thousand times the minimum dimension of the patterns. Typically the invention enables metallizing fields of nano-wires when the amplitude of the reliefs is greater than one hundred times the minimum dimension of the patterns.

In general, the invention is particularly advantageous when the reliefs of the textured surface have amplitude greater than half the minimum width of the patterns. The invention is even more advantageous when the texture is even more marked and when the reliefs of the textured surface have amplitude greater than the minimum width of the patterns. Typically, this minimum dimension also called the minimum width is the width of a line, a groove or a trench formed by the pattern. The width of the line, the groove or the trench is the dimension measured along a direction perpendicular to the direction along which it mainly extends.

In general, the minimum width of a pattern is the minimum dimension thereof measured in a plane perpendicular to the direction of feed motion of the mold during the step of pressing. This minimum width is thus measured in a plane substantially parallel to that of the substrate surface. Preferably it is measured at the base of the pattern.

Said reliefs of the textured surface have a pyramidal shape and/or a cylindrical shape with a circular section and/or a polygonal shape and/or form corrugations and/or grooves.

The step of preparing comprises a step of obtaining a base substrate the surface of which surface is textured and a step of forming a layer of amorphous silicon covering at least partially said textured surface. Advantageously, such step makes it possible to obtain heterojunction photovoltaic cells.

The step of preparing includes a step of doping a base substrate with charge carriers so as to make it electrically conducting or semiconducting. In an alternative solution, and preferably when the substrate is not conducting or only slightly conducting, the step of preparing includes a step of obtaining a base substrate the surface of which surface is textured and a step of covering said surface textured with an electrically conducting layer. This step can also be applied to a doped substrate. When a layer of amorphous silicon has been plated or formed on the base substrate, for example to produce heterojunction photovoltaic cells, the electrically conducting layer is plated so as to cover at least partly the amorphous silicon layer. Thus, the invention applies whether the base substrate is conducting, semiconducting or insulating.

Preferably, the substrate is made of silicon. Advantageously it is made of single-crystal silicon. The substrate can also be polycrystalline.

The electrically conducting layer is a layer of tin-doped indium oxide (ITO).

The conducting or semi-conducting material is a metal selected from aluminum, copper, silver, platinum, iron, gold.

After the step of electrodeposition, a step of annealing is carried out. Advantageously, this step allows on the one hand changing the crystallinity of the deposit so as to reduce the resistivity thereof and on the other hand improving the compliance of the deposition of the conducting or semiconducting material. The latter then perfectly adheres to the shape of the textured surface. The contacts are of good quality. A good compliance of the deposition reflects an intimate contact between the conducting material and the substrate. It therefore reflects an interface with a low resistivity.

The step of electrodeposition is performed so that the conducting or semiconducting patterns material protrudes beyond the textured surface. The patterns made thus extend beyond the reliefs. The result is over-deposition. According to a particular embodiment over-deposition completely fills the pattern imprinted in the imprintable material and extends beyond it. Thus, the conducting or semi-conducting material forms a protrusion on the free surface of the imprintable material. Advantageously, this facilitates interconnections.

The imprintable material is electrically insulating.

The step of electrodeposition is performed so that the patterns made of the conducting or semiconducting material protrude beyond the imprintable material.

The imprintable material is transparent and kept after the step of electrodeposition. The imprintable material thus forms a protective layer without changing the optoelectronic characteristics of the device.

Typically, the imprintable material is of the SOG (Spin On Glass) type. It is for example phosphosilicate- or siloxane- or silsesquioxane-based.

After the step of electrodeposition the method comprises a step at least partially removing the imprintable material.

The imprintable material is thermosetting.

The imprintable material is a photosensitive resist, wherein the mold comprises a masking coating at least partially stopping the exposure of the resist that it selectively covers either outside the patterns only or on at least one of the patterns only, and comprising a step of exposing intended to activate the resist not masked by the masking member, prior to the step of removing the mold.

In a first embodiment, the resist is a positive resist and the masking coating covers the mold outside the end of the patterns. In a second embodiment, the resist is a negative resist and the masking coating covers the mold at least on the end of the patterns.

According to an advantageous embodiment, during the step of coating, the volume of the layer of an imprintable material plated onto said textured surface is equal to $V_{layer}$, with $$V_{layer} = V_{mold} + V_{fill} + V_{safety}$$

with:

$V_{mold}$=the volume defined by the mold patterns and intended to be filled with resist during the step of pressing.

$V_{fill}$=the free volume between the textured surface and a plane which is parallel to the substrate and goes through the highest point of the relief having the greatest amplitude.

$V_{safety}$=(surface of the substrate)×(safety thickness), the distance between the peak of the highest relief and the end of the mold patterns.

Preferably, the safety thickness $e_s$ is defined as follows:

$$(e_s) \leq 2H_m - (A)$$

with:

$H_m$=the height of the mold patterns.

A=the maximum amplitude of the reliefs. This distance is defined as the difference between the height of the highest relief and the lowest valley of the textured surface.

According to an advantageous embodiment, if the aspect ratio of the reliefs of the textured surface is greater than or equal to 3, the width of the mold patterns is greater than the minimum width of the reliefs of the textured surface. This condition preserves the texturing of the textured surface while defining narrow patterns.

If the aspect ratio of the reliefs of the textured surface is less than 3, then the width of the mold patterns may be less than or equal to the minimum width of the reliefs of the textured surface or texturing period.

According to another embodiment, the invention provides a method for making electrically conducting or semiconducting patterns on a textured surface comprising a plurality of reliefs having amplitude greater than or equal to 100 nanometers, characterized in that comprises the steps of:
- a step of preparing a substrate in which at least the whole of the textured surface of the substrate is made electrically conducting;
- a step of coating during which at least one layer of an imprintable material is directly plated onto the textured surface, made electrically conducting, by nanometric imprinting;
- a step of pressing a mold having valleys or protrusions so as to transfer the valleys or protrusions of the mold into the imprintable material to form patterns therein;
- a step of removing the mold while leaving the imprint of the patterns in the imprintable material;
- a step of exposing the textured surface, of the substrate, at the bottom of the patterns;
- a step of electrically deposition at least an electrically conducting or semiconducting material into the patterns to form conducting or semiconducting patterns.

According to another aspect, the invention relates to a method for producing one or more photovoltaic cells comprising the method described above.

Within the scope of the present invention, a semiconducting device comprising a substrate having a textured surface having a plurality of reliefs is also provided. The device also includes conducting or semiconducting patterns plated onto the textured surface of the substrate, with the textured surface of the substrate being electrically conducting and the substrate comprising a transparent material plated between the patterns.

Optionally, the device according to the invention further comprises at least one of the following characteristics:

The substrate comprises a base substrate covered with an electrically conducting layer. In this embodiment, the base substrate is insulating or poorly conducting. Alternately, the base substrate is conducting or semiconducting.

The semiconducting or conducting patterns form protrusions beyond the transparent material.

The transparent material is of the "Spin On Glass" (SOG) type. It is insulating.

In another embodiment, the invention provides a semiconducting device comprising a substrate having a textured surface having a plurality of reliefs, with the amplitude of at least some reliefs being greater than or equal to 100 nm, with the device further comprising patterns formed in a conducting or semiconducting material and plated onto the textured surface of the substrate. At least the textured surface underlying said patterns is electrically conducting and the device comprises at least one transparent material plated between the patterns.

Preferably, the substrate comprises a base substrate covered with an electrically conducting layer.

Preferably, the patterns formed in a conducting or semiconducting material form protrusions beyond said transparent material.

In another embodiment, the invention provides a semiconducting device comprising a substrate having a textured surface having a plurality of reliefs, with the device also comprising conducting or semi conducting patterns plated onto the textured surface of the substrate, with the conducting or semiconducting patterns being produced by any one of the methods according to the invention.

Preferably, the device comprises inter patterns formed in the layer of imprintable material, between the patterns.

Advantageously, the device comprises one or more photovoltaic cells. According to a particular embodiment, the textured surface of the base substrate comprises amorphous silicon. This characteristic is particularly advantageous for the production of heterojunction photovoltaic cells.

BRIEF DESCRIPTION OF THE FIGURES

The objects, as well as the characteristics and advantages of the invention will become more apparent from a detailed embodiment thereof which is illustrated by the following appended drawings, wherein.

The appended drawings are given as examples and are not restrictive of the invention.

DETAILED DESCRIPTION

FIG. 1, composed of FIGS. 1a to 1h, describes the essential steps of a method corresponding to a first implementation of the invention.

This first implementation does not refer to a particular type of device to be produced. It describes the steps necessary to obtain narrower metallizations than those which can be obtained on a substrate by screen printing while maintaining a good electrical contact with the textured surface of the substrate and allowing the use of metals conducting electricity much better than the metal pastes usually used in screen printing. Typically the known screen printing methods do not allow obtaining metallized lines whose thickness is less than 80 microns.

Figure 1A:
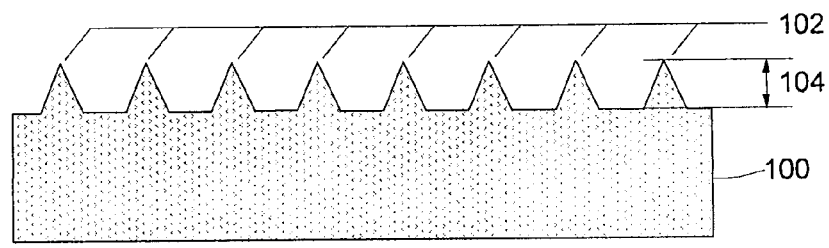
FIG. 1 illustrates the different steps of a method according to an exemplary embodiment of the invention.

As shown in FIG. 1a, the substrate 100, usually silicon, is surface-textured. The invention makes no assumption about how the texturing is achieved nor even if it is produced intentionally. The skilled persons know, however, how to produce a surface texturing to improve devices, more particularly optoelectronic devices. Physico-chemical methods such as the one mentioned in the chapter on the state of the art are known. In the case of single-crystal silicon, a wet anisotropic etching is common practice for the production of micrometer-sized electromechanical systems known by their acronym MEMS.

To make textured surfaces with pyramid-shaped reliefs, the following techniques are known, for example:
- the production of pyramids by attack with KOH for potassium hydroxide or TMAH for tetramethyl ammonium hydroxide, which is selective and allows the exposure of the planes (1-1-1) of silicon and thus the formation of the pyramids.
- the production of a so-called "inverted pyramid" structure by chemical etching after a step of lithography.

The invention also makes no assumption on the geometry of the texture produced. It is schematically shown here arbitrarily as reliefs forming pyramids 102, and thus having a triangular cross-section, regularly spaced 102 without the application of the invention to any other type texturing being restricted whatsoever.

The reliefs 102 might as well have circular or polygonal-shaped sections in a plane normal to the free surface of the substrate or normal to the same surface. The reliefs 102 may also have curved shapes. They may, in particular, be corrugations of the substrate surface.

In addition, the space between two patterns is not necessarily constant. Moreover, the reliefs of the same substrate can have a variety of forms.

Not restrictively, the amplitude of the relief 102 produced by texturing typically ranges from one hundred nanometers to several tens of microns (1 micron=$10^{-6}$ meter) and more particularly from 1 to 25 microns for the application. Generally the amplitude of a relief 102 is defined as the distance between the highest point and the lowest point thereof. This distance is measured along a direction substantially normal to the substrate surface. More particularly this direction is normal to the median plane of the substrate surface. It is generally normal to the direction of feed motion of the mold during the step of pressing. In the examples illustrated, the direction is vertical and normal to the Figures. In the examples illustrated, the amplitude of the reliefs, bearing reference number 104, is the distance between the base and the apex of the triangle.

The size of the base of the reliefs ranges from 3 to 25 microns and more preferably from 4 to 15 microns. The size of the base of the reliefs is the maximum dimension of the relief measured at the protruding portion thereof with respect to the substrate surface between two reliefs.

Figure 1B:
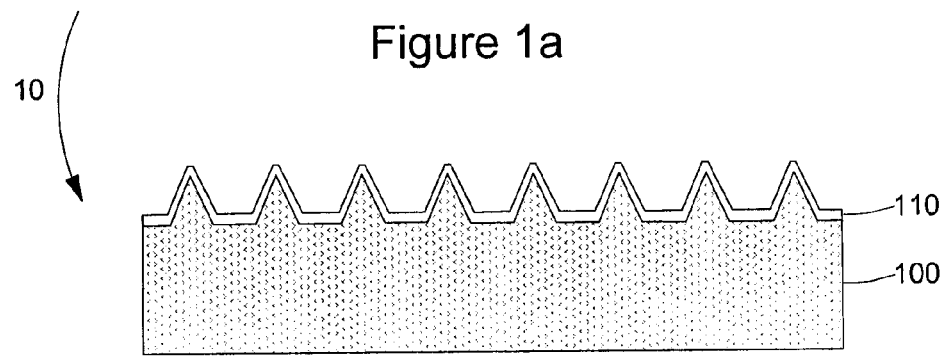

The pitch of a textured surface corresponds to the average distance between two consecutive reliefs. For example, the pitch of the textured surface ranges from 2 to 20 microns and more particularly from 4 to 15 microns. For example for a 9 µm pitch, the inverted pyramid-shaped reliefs are 6 µm deep and for a 15 µm pitch they are 10 µm deep. Typically, the pitches are measured between two apexes of a pyramid. As will be seen below the method according to the invention requires the substrate 100, 110 to be at least an electrically conducting surface. The first step 10 of the method, an optional step, the result of which is schematically shown in FIG. 1b, consists in depositing a layer 110 of an electrically conducting material onto the surface of a base substrate 100, if necessary. A substrate 100, 110 consisting of a base substrate 100 and the conducting layer 110 is thus obtained. The conducting layer 110 conforms to the shape of the base substrate and thus reproduces the texture of the base substrate 100.

In the case of production of optoelectronic devices it may have to be transparent too. A material such as ITO (for "indium tin oxide" i.e. tin-doped indium oxide) may advantageously be used. This layer will not be necessary if, for example, the substrate made of silicon is sufficiently doped to be conducting. If the base substrate 100 is not sufficiently insulating or conducting, the conducting layer is required.

Figure 1C:
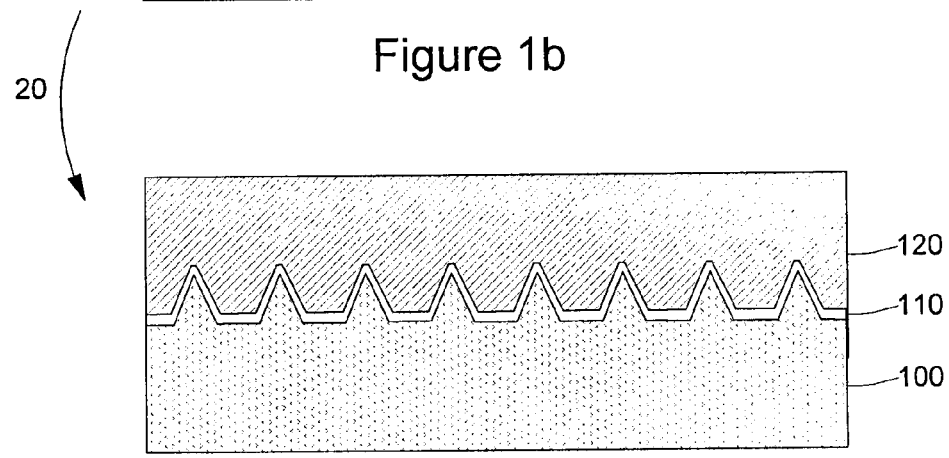

The next step 20 of the method, the result of which appears in FIG. 1c, consists in deposition a layer 120 of a material such as a resist, which will be liable, as will be discussed in the next step, to receive an imprint from a mold 130 of the type used in the so-called nanometric imprinting lithography technique, known by the acronym NIL, (for "nano-imprint lithography"). The two main techniques for nanometric imprint lithography are briefly described below. The invention is limitative neither as regards the type of material used for the layer 120 nor as to how to deposit same. For example, in the case of a photosensitive liquid resist, the deposit may simply be executed by spin centrifugation also known as "spin-coating" and universally used by the microelectronics industry. All the other deposition techniques used in the industry may be used such as vacuum deposition, heat evaporation etc.

The layer of imprintable material is a dielectric. It is not electrically conducting.

Materials known as "spin on glass" or SOG may advantageously be used for the layer 120. These are dielectric materials. Available as liquids, they can also be simply deposited by "spin-coating", like the resist. Within the development of the present invention, these SOG materials proved particularly suitable to fill the textured surface regardless of the shape and amplitude of the reliefs formed therein.

Phosphosilicate- or silsesquioxane- or siloxane-based materials, for example may be used. Dow Corning Inc.'s SOG, for instance HSQ for hydrogen silesquioxane may also be used. Nanometric imprint lithography consists of two main techniques. The first one, called T-NIL for "thermal nano-imprint lithography", consists in imprinting heated thermoplastic monomers or polymers with an opaque mold having valleys and/or protrusions. After cooling, the mold can be removed, and the imprinted patterns remain. The second technique, referred to by the symbol P-NIL for "photo-curable nano-imprint lithography" consists in imprinting a photosensitive resist with a transparent mold having valleys and/or protrusions and in producing an optical exposure of the resist film therethrough. The exposure causes the cross-linking of the resist film that solidifies.

Figure 1D:
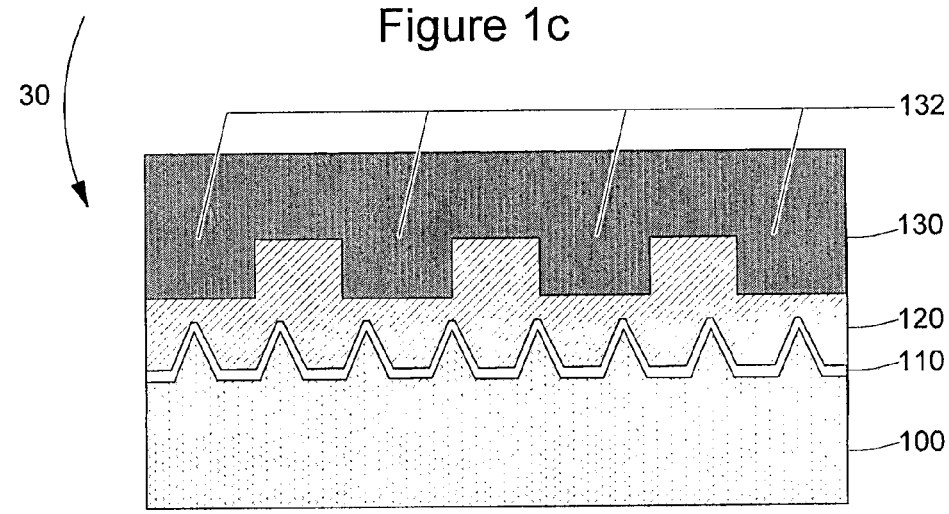
Figure 1E:
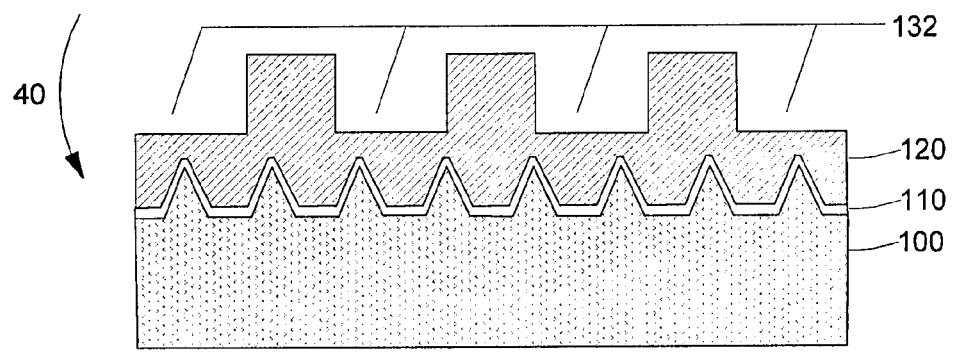

The next step 30 thus consists in applying, as shown in FIG. 1d, a mold 130 wherein mold reliefs are etched. These mold reliefs correspond to the metallization patterns 132 which must be reproduced on the device being produced. The penetration of the mold 130 into the layer 120 imprints, by pressure, the reliefs of the mold 130 therein.

The mold 130 may be made removed during the step 40 when the layer 120 has sufficiently solidified to keep the shape of the patterns 132. The result is the one shown in FIG. 1e. As mentioned above, depending on the nature of the material deposited to form the layer 120 and the type of mold used, whether opaque or transparent, solidification can implement very different mechanisms. It should be noted that when an initially liquid or at least low viscosity material, such as photosensitive resist, is used, the deposition is easily performed by centrifugation and the pressure to be exerted is low, which can be an advantage for the industrial implementation of the method. As regards the SOG mentioned above, which is in liquid form it solidifies by annealing.

Figure 1F:
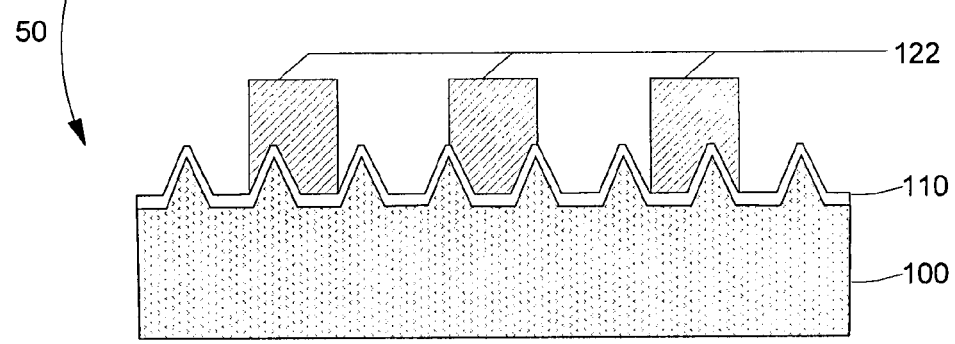

Whatever the technique used by the method for the step of nanometric imprint lithography, the created patterns 132 are often not directly usable as some of the material used to form the layer 120 remains at the bottom of the imprinted trenches. The next step 50, the result of which is shown in FIG. 1f, consists of an attack on the layer 120 to expose, at the bottom of the trenches, the underlying conducting layer i.e. the ITO layer 110 in this example. For this purpose, for example a so-called RIE etching (for "reactive ion etching") can be executed in presence of oxygen plasma. This etching is uniform, and the same amount of material is removed over the entire surface. The operation is stopped when the resist located at the imprinted areas is completely etched whereas a sufficient resist thickness remains on the other areas, corresponding to the areas between the patterns to be metallized.

Another way consists in a chemical wet etching during which a controlled thickness of material is removed over the entire surface.

In both cases the methods for which the attack of the underlying conducting layer 110 is selective, ITO in this example can be privileged, i.e. the methods wherein the attack of the underlying conducting layer 110 is much less fast than that of the imprintable layer to facilitate the industrial implementation of this step.

In all cases this can be done without substantial deformation of the imprinted patterns. Upon completion of step 1f, only inter-patterns 122 remain from the layer 120. An alternative method is also described in FIG. 2.

At this stage, the patterns can be metallized. Step consists in an electrodeposition, also called electrochemical deposition, of a good electrically conducting metal onto the ITO layer 110 or directly onto the substrate 100, if it is itself a pretty good conductor as discussed above.

Figure 1G:
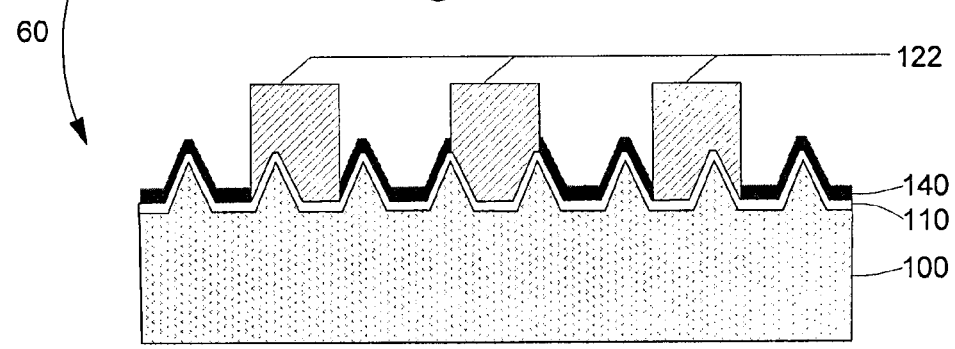

Electrodeposition is a common operation in the chemical industry for depositing metal on objects of all kinds. It is executed in the liquid phase in a tank containing a metal salt in acid or alkaline solution. In the case concerned the semiconducting wafer whereon the devices are being produced, and whose structure corresponds to FIG. 1f, is completely immersed in the bath. The wafer is electrically connected to the negative pole of a power source. The other pole is connected to an electrode itself immersed and consists of the metal to be deposited or an inert electrode, for example made of platinum and having a large surface area. Under the action of the electric current, the metal ions contained in the electrolyte are deposited onto the cathode i.e., onto the wafer in areas that are not protected by the inter-patterns 122 to form a metal layer 140 as shown in FIG. 1g. A large variety of metals can be deposited by this technique in particular, for the type of applications concerned where a very good contact resistance with the substrate and as low as possible a series resistance of the interconnections are required, i.e. all those which are very good electrical conductors such as copper, silver, gold etc.

Depositing semiconducting materials such as metal oxides like Cu2O, p-type or ZnO semiconducting materials may also be considered.

For all the characteristics of the method according to the invention and for all the devices of the invention, a semiconducting material which can be deposited by electrodeposition may be substituted for the deposited metal.

Figure 1H:
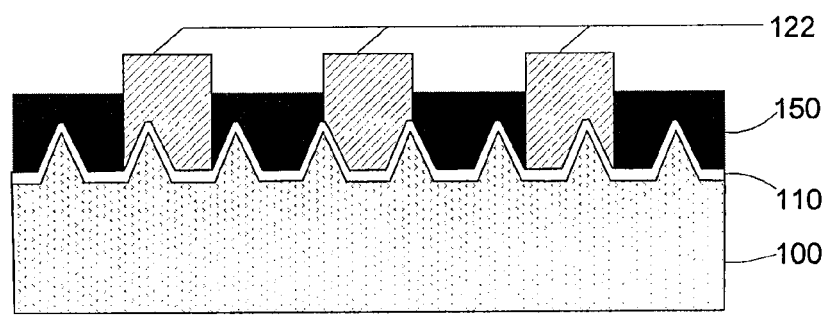

The metal layer 140 is said compliant, i.e. growth is equal in all directions on the textured substrate. Typically but not restrictively, the thickness of the layer ranges from a few nanometers to several tens of microns. Over-deposition can be performed so as to obtain a thick layer 150 as shown in FIG. 1h, to reduce the series resistance of the interconnections.

Over-deposition refers to a deposit of a conducting or semiconducting material executed so that it exceeds the thickness of the resist material. Over-deposition is the continuation of the electrodeposition.

Figure 2:
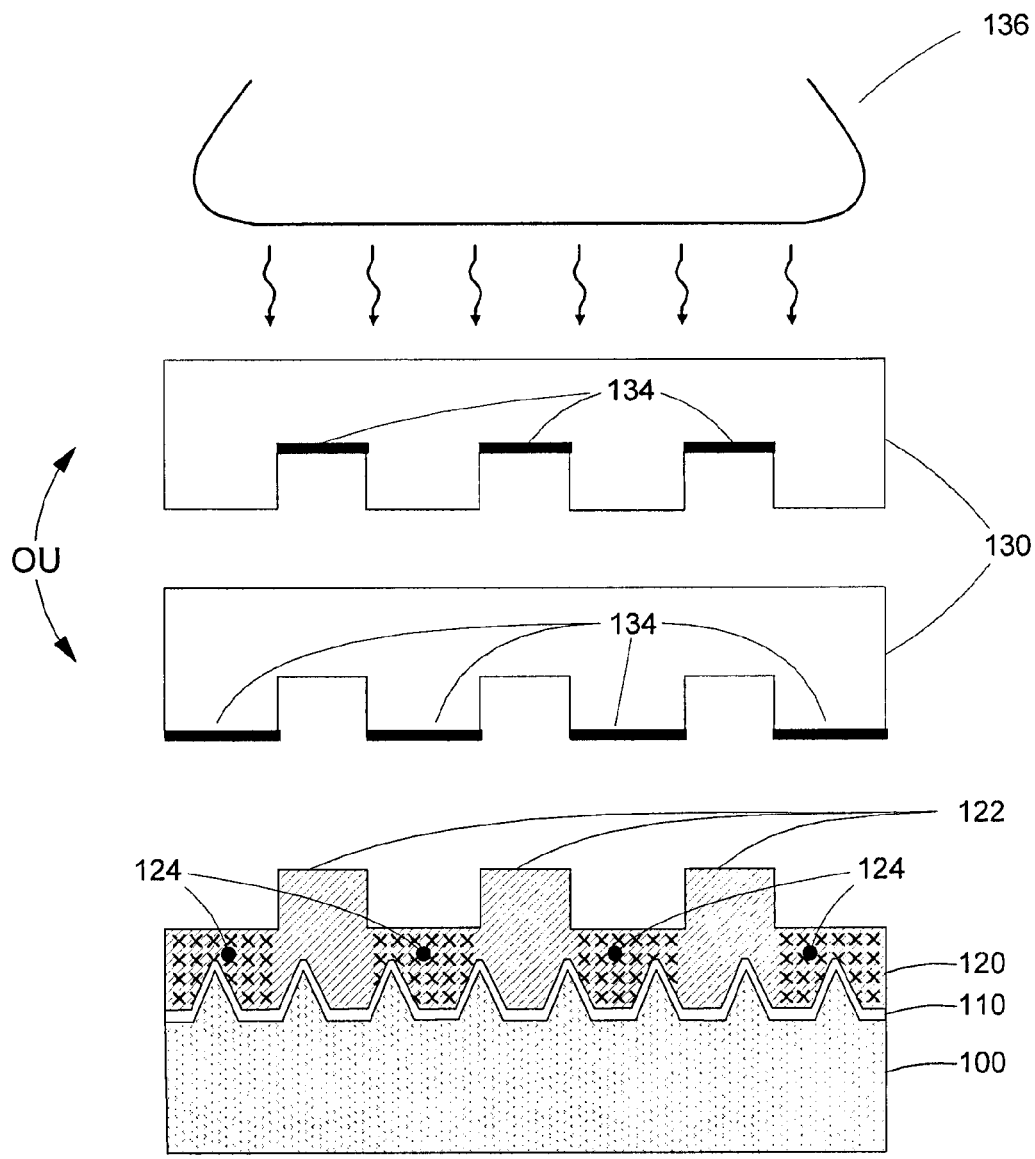
FIG. 2 illustrates a particular embodiment of one of the steps of the method according to the invention.

FIG. 2 shows an alternative implementation of the step 50 of the method that involves the exposure of the underlying layer, at the bottom of the imprinted trenches.

In this alternate implementation, a photosensitive resist is used for the imprintable material layer 120. The mold 130 is made of a transparent material. However, it is made so that the protruding reliefs or valleys of the mold are made opaque depending on whether the resist used is, respectively, a positive or a negative resist. More specifically, the mold 130 includes a masking coating 134 at least partially stopping the exposure of the resist it selectively covers either only outside the protrusions of the mold 130 or only on at least one protrusion of the mold. The method then comprises, before the step of removing the mold, a step of exposure to enable the unmasked resist to be activated by the masking coating 134.

If the resist is a positive resist, then the masking coating 134 covers the mold 130 outside the ends of the protrusions of the mold 130. If the resist is a negative resist, then the masking coating 134 covers the mold 130 on the ends at least of the protrusions as shown in FIG. 2.

Thus, when the layer 120 is exposed 136 through the mold 130 the parts 124 compressed by the mold protrusions become or remain soluble, depending on whether the resist is respectively positive or negative and it has actually been exposed or not. Advantageously, to expose the underlying layer 110, the resist must simply be dissolved as in a conventional photolithography method. As previously, only the inter-patterns 122 remain in place to enable the following metal electrodeposition as described with reference to FIGS. 1g and 1h.

FIG. 3 describes the particular implementation of the method for the production of heterojunction photovoltaic cells.

As discussed in the chapter on the state of the art, the metallization of the heterojunction photovoltaic cells is currently executed by screen printing. A silver paste is deposited and spread through a stencil applied to the metal surface to be metallized. The electrical contact between the ITO layer and the metallization is not perfect. The screen printing makes only an imperfect compliance with the substrate roughness possible. To improve the electrical contact between the silver deposition and the substrate, as we have seen, annealing must be carried out, which does not damage the other layers already deposited of the device and more particularly the amorphous silicon used in photovoltaic cells.

In the general context of the improvement and ever greater integration of semiconducting devices, reducing the width of the metallization while maintaining or reducing the contact and interconnections resistance is particularly important in the case of photovoltaic cells. A crucial parameter for photovoltaic cells is indeed the shadowing caused by metallization. The shadowed areas are not involved in the production of current and therefore reducing their surface must be possible, while allowing the generated current to be transported at the device outlet without significant ohmic losses.

Figure 3A:
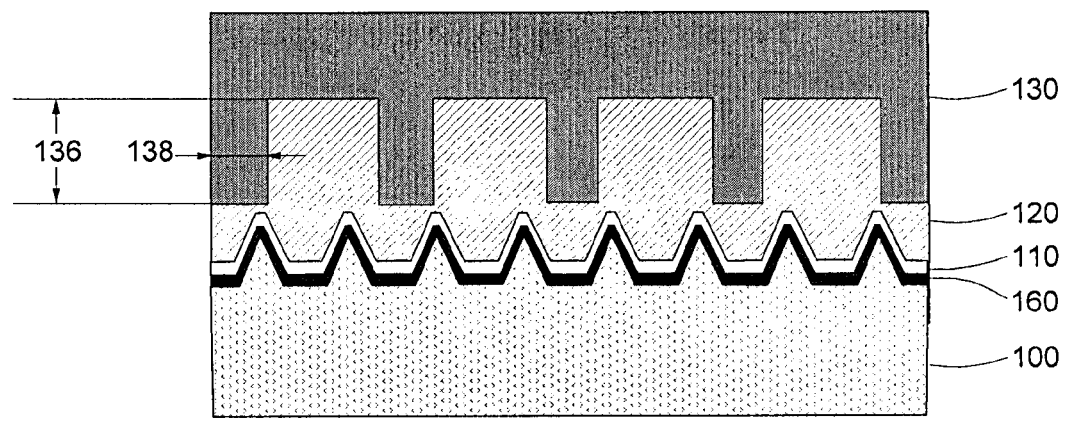
FIG. 3 illustrates the different steps of a method according to another embodiment of the invention, a particularly suitable example for the production of heterojunction photovoltaic cells.

The method described above in FIGS. 1a to 1h provides this result. FIG. 3a shows the structure of a device of the photovoltaic cell type being produced. FIG. 3a must be compared to FIG. 1 where the mold 130 is applied to imprint the layer 120. The main difference is the presence of an amorphous silicon layer 160 necessary for the production of a heterojunction with the silicon substrate 100 underneath.

Figure 3B:
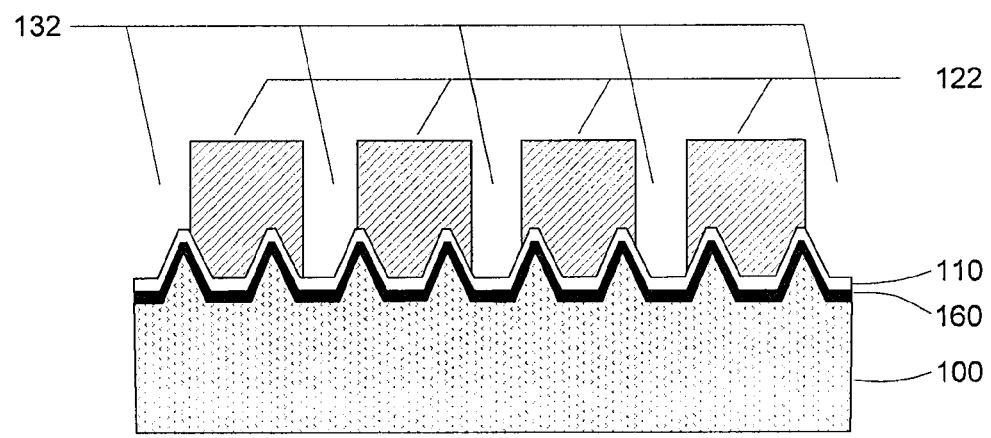

FIG. 3b, which is to be compared to FIG. 1f shows the inter-patterns 122 that remain in place after applying the step 50 of the method where the material of the layer 120 that has been compressed by the mold has just been removed, at the bottom of the imprinted trenches. Either one of the methods described in FIG. 1 or 2 may be used to expose the underlying ITO layer 110 at the bottom of the trenches 132.

Figure 3C:
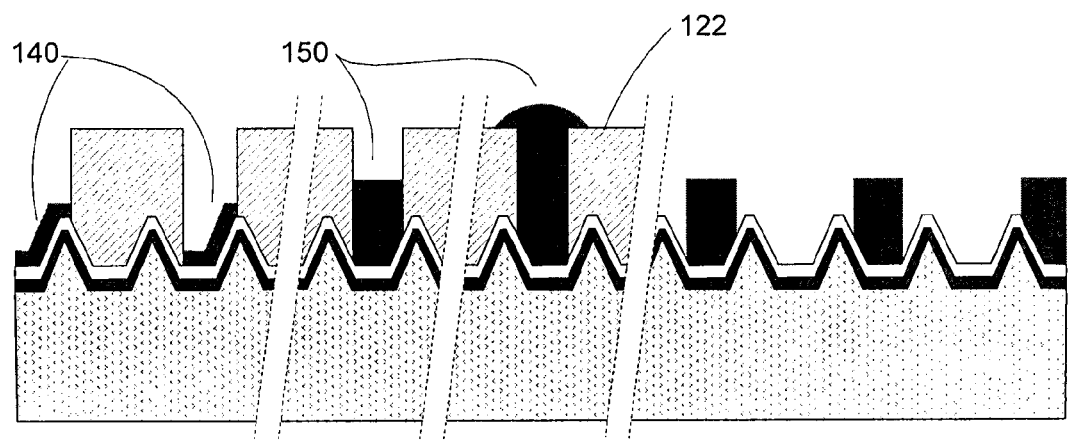

FIG. 3c shows the various results that can be obtained after the step of electrodeposition 60. Metal deposition having a compliant thickness of a few mono-atomic layers that conform to the texture surface 140 can thus be obtained. A larger deposit makes it possible to partially or completely fill the cavities formed by the nanometric imprinting in the resist. A "mushroom"-shaped over-deposition can be obtained by extending the electrodeposition, and the contact is facilitated since the contact surface is larger. Different electrodeposition levels may also be obtained 150. It should also be noted that the inter-patterns 122 may or may not stay in place. More particularly, using for the layer 120 a material such as the previously mentioned SOG, which remains transparent after solidification by annealing may also provide protection to the device, in which case it is not removed after metallization.

The method according to the invention makes it possible to form very narrow patterns, typically up to 10 nanometers. For example, it makes it easy to form 10-micron wide metal lines for the reliefs the dimensions of which have been given above, with the contact between these lines and the substrate being very good.

In general, the invention advantageously enables patterns the width of which ranges from 10 nm to 100 μm whatever the aspect ratio of the reliefs on the surface as compared to the aspect ratio of the patterns to be produced by imprinting.

Figure 4:
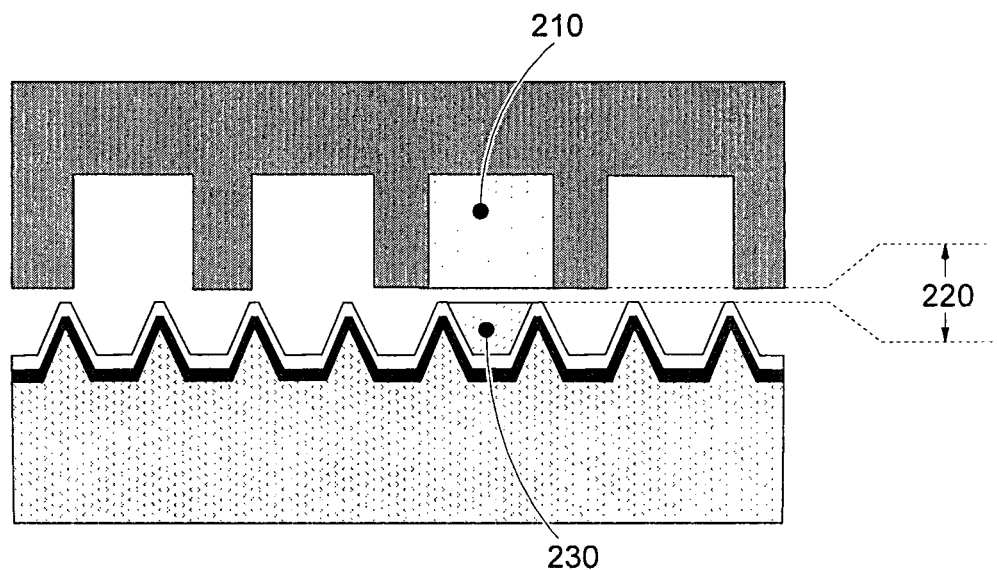
FIG. 4 illustrates a way to calculate the amount of imprintable material to be deposited on the substrate before imprinting.

FIG. 4 illustrates how to calculate the amount of resist or material that is required for deposition onto the substrate before imprinting.

A quantity of resist or material constituting the layer to be imprinted sufficient to fill, after pressing, all the mold valleys and all the grooves and, in general, all the crevices created by texturing at the substrate surface, must be deposited onto the plate being produced. Furthermore, it is desired to maintain, after pressing the mold, a minimum thickness 220 between the peaks of the mold patterns and those of the substrate crevices. Typically, the minimum thickness is only a few tens of nanometers (nm=$10^{-9}$ meter).

The amount of material to be deposited can easily be calculated based on the one hand, on the geometry of the mold patterns and the height thereof, and on the other hand, on the volume of the crevices which must be filled plus the thin layer that must be maintained between the mold and the substrate crevices. The crevices volume can be easily calculated if texturing has simple geometric shapes such as those used in the Figures illustrating the invention or experimentally estimated from a textured substrate.

The minimum height of the mold patterns directly depends on the aspect ratio desired for the interconnections as shown in FIG. 3c. The patterns width along a direction substantially normal to the direction of the application of the mold can vary typically from 20 nm to several microns. The spacing thereof may vary in a range from 100 nm to several hundreds of microns.

The mold application pressure mainly depends on the technique and the material used for the layer 120. Liquid or low viscosity materials such as photosensitive resists wherein solidification is obtained by irradiation (P-NIL) or annealing (SOG) allows a low pressure of the order of 1 to 2 bars. Printing is then executed at room temperature. Photosensitive resists can be polymerized or cross-linked. These are for example epoxy, vinyl, acrylate and methacrylate resists.

Pressures ranging from 2 to 15 bars may be required if the material to be imprinted (T-NIL) must be heated. This parameter highly depends on the imprinting time desired and the temperature reached by the material to be imprinted and therefore the viscosity thereof at the time of imprinting. Increasing the temperature of imprinting reduces the viscosity of the material and thus the pressure applied and/or the imprinting time can also be reduced. The imprinting temperature depends on the material chosen. For a thermoplastic material, for example a PMMA (polymethyl methacrylate), polystyrene, polycarbonate or polyolefin resist temperature must be over glass transition. For a thermosetting material, for example for epoxy or polyether resists, imprinting is executed at a temperature lower than the hardening temperature. Mold stripping is then achieved by raising the temperature above the hardening temperature and after stabilization of the material.

In addition, the control of the deposit and of the growth of the metal layer during the electrodeposition step implements many parameters and physicochemical mechanisms, some of which are discussed below:

Knowing the total surface of the substrate, including the effect of texturing the latter, and assuming at first that the yield of the electrodeposition reaction is close to 100%, Faraday's law, mentioned below makes it possible to determine the number of moles deposited. The time required to obtain the desired thickness of metal can then be estimated as a function of the applied current.

$$\frac{It}{nF}M = m$$

With I: the current value, t: time, n: the number of electrons exchanged in the redox reaction, F: Faraday number, M: the molar mass of the deposited material and m: the number of moles deposited.

If the reaction yield is less than 100%, one or more unwanted reactions may occur at the expense of the main deposit reaction. One of the most common unwanted reactions in acidic medium is the reduction of H+ ions into hydrogen. Depending on the constituents of the electrolyte, other cations than the metal cations to be deposited can be reduced. Imparted potential deposition may help overcome this problem. Indeed, the imparted potential deposition secures the potential to a value whereat the reaction of interest occurs. Thus the risks of occurrence of an unwanted reaction are limited. On the other hand, it also allows better control of the deposit nucleation mechanisms. Knowing the number of electric charges expressed in coulombs passing through the selected potential deposition system, and considering the deposition is compliant, the thickness deposited can easily be estimated and over-deposition can be executed.

In addition there are two types of nucleation and three modes of growth summarized below:

instantaneous nucleation: all sites begin to grow at the same time.

progressive nucleation: germination progressively increases in the sites.

Franck Van Der Merwe growth or layer by layer growth. This is an ideal case rarely observed. The deposit is uniform, a new layer is formed only when the previous one is completed. This type of growth occurs only on surfaces without defects, and growth is two-dimensional. In the case of photovoltaic cells where the material is not of high quality, many surface defects make this mode unlikely.

Stranski-Krastanov growth. At first sub-layers are formed, then clusters grow. This phenomenon occurs in the case of a surface with defects, and growth is three-dimensional then.

Volner-Weber growth. In this case the clusters are formed directly on the metal surface, without sub-layers.

Depending on the mode of germination and growth, the deposit will be more or less compliant. In the case of Stranski-Krastanov or Volner-Weber growth, the deposit will present clusters. Growth limited by the diffusion of material will lead to the formation of a dendritic deposition (growth forming trees, dendrites) which is by definition non-compliant.

The choice of the deposition technique can greatly affect the modes of germination and growth. Thus, to favour a large number of nuclei, pulsed operation is particularly suitable. This type of operation consists in alternating current or potential, reduction cathode pulses, and anodic or abort potential pulses. The greater the number of nuclei and the more compliant the deposit will be. Generally, an abort potential is the potential of an electrode when in contact with an electrolyte. It can be associated to the equilibrium potential of the electrode. A cathode pulse is a current or potential pulse, which generates a reduction. When working with potential, this corresponds to a potential lower than the equilibrium potential. An anode pulse is a current or potential pulse, which generates oxidation. When working with potential, this corresponds to a potential higher than the equilibrium potential.

In the unfavourable case where the various electrochemical methods do not provide a sufficiently compliant deposit for the application, an appropriate annealing will densify the deposit and improve the deposit/substrate interface. The contact with the substrate will be more intimate and the interface will be low resistive. It should also be noted that adding additives in the deposition bath may help making the deposition compliant.

Over-deposition may also be considered to improve the electrical conductivity of the structure and make contact pads of a larger size than the metal/substrate interface as shown in FIG. 3c.

Figure 5:
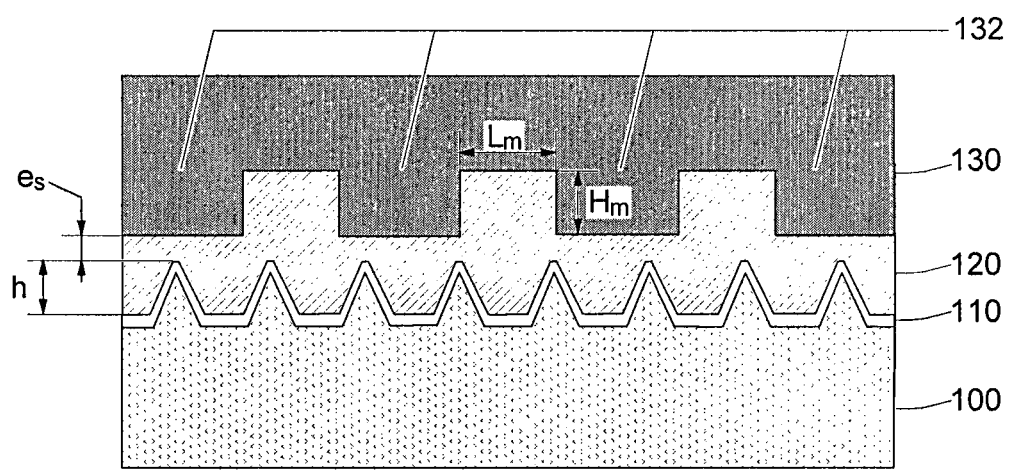
FIG. 5 illustrates another advantageous example to determine the amount of imprintable material to be deposited on the substrate before imprinting.

In FIG. 5, several dimensions are referenced. These dimensions are used to calculate the thickness to be deposited to avoid damaging the reliefs of the textured surface while obtaining low-dimensional patterns by nano-imprint.

According to an advantageous embodiment, during the step of coating, the volume $V_{layer}$ of the imprintable material layer plated onto said textured surface is equal to:

$$V_{layer} = V_{mold} + V_{Fill} + V_{safety}$$

with: $V_{mold}$=the volume defined by the mold patterns. In FIG. 5, the volume $V_{mold}$ is equal to the sum of the individual volumes defined by the widths Lm, the heights Hm and the depths (not shown) of these patterns.

$V_{Fill}$=the free volume between the textured surface and a plane parallel to the substrate and passing through the highest point of the relief of greater amplitude. Typically this plane is perpendicular to the plane of the section shown in FIG. 5. In practice, if the substrate has a plate shape with two opposite faces, the plane is parallel to these faces. Typically, this volume is determined by the analysis of the area occupied by the reliefs of the textured surface of the substrate on an image measured by an atomic force microscope (AFM).

The substrate surface is the area of the macroscopic surface. In other words, this is the area of each face of the plate formed by the substrate.

$V_{safety}$=(substrate surface)×(safety thickness). The safety thickness is represented by reference $e_s$ in FIG. 5. It corresponds to reference 220 in FIG. 4. It corresponds to a minimum thickness of resist between the peaks of the mold patterns and the peaks of the reliefs of the textured surface. Typically, the minimum safety thickness amounts to a few tens of nanometers (nm=$10^{-9}$ meter).

Particularly advantageously, the safety thickness $e_s$ is defined as follows: $(e_s) \leq 2H_m - (A)$:

with:

$H_m$=the height of the mold patterns. In FIG. 5 the width of the mold patterns is referenced $H_m$.

A=the maximum amplitude of the reliefs. This distance is defined as the difference in height between the peak of the highest relief and the lowest valley in the textured surface. This amplitude is also referred to as "peak to valley" amplitude of the highest relief. Using the AFM microscope, the highest relief of the textured surface and the lowest valley of the textured surface are easily determined and the height difference therebetween is easily determined. In FIG. 5, this maximum amplitude is referenced "h".

Also advantageously, $H_m \geq (A)$

Advantageously, the fulfillment of these conditions results in a high quality transfer of mold patterns without damaging the reliefs of the textured surface.

According to an advantageous embodiment, if the aspect ratio of the reliefs of the textured surface is greater than or equal to 3, then the width of the mold patterns is greater than the minimum width of the reliefs of the textured surface.

This condition preserves the texturing of the textured surface while defining narrow patterns. In FIG. 5, the width of the reliefs is the width of the base of a relief forming a triangle in the layer 100 or in the layer 110.

Aspect ratio of the textured surface means the 'h'/'l' ratio, wherein 'h' is the height of the reliefs and 'l' the width of the reliefs. In FIG. 5, the width of the mold patterns is referred to as $L_m$.

Preferably, if the aspect ratio of the reliefs of the textured surface is less than 3, then the width of the mold patterns may be smaller than or equal to the minimum width of the reliefs of the textured surface or texturing period.

In summary, the invention describes a method for producing electroplated metal lines or patterns of submicron dimensions on a substrate having a micrometer roughness or sharp texturing. The electrochemical deposition takes place through a hard mask obtained by imprinting a mold.

The electrochemical deposition makes it possible to produce compliant deposits and to obtain a consistent and quality electrical contact on surfaces having a high roughness or texturing.

The imprinting of patterns from a mold provides good resolutions with important field depths in spite of a strong layering of the substrate.

The method of the invention advantageously applies to the production of photovoltaic cells. It makes it possible to produce the electrical contacts and the interconnections with a pure metal other than silver pastes conventionally used in screen printing. This improves the electrical conductivity of metallization and reduces the dimensions thereof without reducing, or even while improving the performance of the produced devices. In addition, the small size of the metallic patterns reduces the shadowing of the substrate which also helps improving the performances of the devices.

Furthermore, the invention provides a good contact between the metallic patterns and the substrate even when the surface intended for receiving said patterns has large surface defects such as:

the presence of grain boundaries creating surface steps due to different heights of grains, surface corrugations appearing during the cutting of plates, for example when using a saw, plates can be bevelled.

These defects are particularly often found when using polycrystalline substrates. However, these substrates, which are much cheaper than single-crystal silicon substrates, tend to be extensively used, especially in the field of photovoltaic cells. Thus, the invention has undeniable advantages as regards industry and economy, in that it makes it possible to correctly deposit metal patterns on such polycrystalline substrates.

The applications of the invention are not limited to the production of photovoltaic cells but extend to other applications such as e.g. metallization of nano-wires fields.

The invention claimed is:

1. A method for creating electrically conducting or semiconducting patterns on a textured surface, comprising:
    providing a substrate having a textured surface formed by a plurality of reliefs of amplitude greater than or equal to 100 nanometers;
    preparing the substrate to make the whole of the textured surface of the substrate electrically conducting;
    coating at least one layer of an imprintable material on the textured surface which was made electrically conducting;
    pressing a mold comprising valleys and protrusions such that the valleys and the protrusions of the mold are transferred into the imprintable material to form patterns therein;
    removing the mold while leaving an imprint of the patterns in the imprintable material;
    etching bottom portions of the patterns to expose the textured surface at a bottom of the patterns; and
    electrically depositing at least an electrically conducting or semiconducting material into the patterns to form conducting or semiconducting patterns on the textured surface.

2. A method according to the claim 1, wherein the reliefs of the textured surface have amplitude greater than one-tenth times a minimum width of the patterns.

3. A method according to claim 2, wherein the reliefs of the textured surface have amplitude greater than a minimum width of the patterns.

4. A method according to claim 1, wherein the patterns have a width ranging from 10 nm to 100 μm.

5. A method according to claim 1, wherein the reliefs of the textured surface have an inverted or non-inverted pyramidal shape and/or an inverted or non-inverted cylindrical shape with a circular section and/or an inverted or non-inverted polygonal shape and/or form corrugations and/or grooves.

6. A method according to claim 1, wherein the preparing comprises obtaining a base substrate including a textured surface and forming a layer of amorphous silicon covering at least partially the textured surface.

7. A method according to claim 1, wherein the preparing comprises doping a base substrate with charge carriers so as to make a surface of the base substrate electrically conducting or semiconducting.

8. A method according to claim 1, wherein the preparing comprises obtaining a base substrate including a textured surface and covering at least a part of the textured surface with an electrically conducting layer.

9. A method according to claim 8, wherein the electrically conducting layer is a layer of tin-doped indium oxide (ITO).

10. A method according to claim 1, wherein the conducting or semi-conducting material is a metal selected from aluminum, copper, silver, platinum, iron, gold.

11. A method according to claim 1, further comprising annealing the substrate after the electrically depositing.

12. A method according to claim 1, wherein the electrically depositing is performed so that the conducting or semiconducting patterns protrude beyond the imprintable material.

13. A method according to claim 1, wherein the electrically depositing is performed so that the conducting or semiconducting material protrudes beyond the reliefs of the textured surface.

14. A method according to claim 1, wherein the imprintable material is transparent and wherein the imprintable material is kept after the electrically depositing.

15. A method according to claim 1, further comprising at least partially removing the imprintable material after the electrically depositing.

16. A method according to claim 1, wherein the imprintable material is thermosetting.

17. A method for creating electrically conducting or semiconducting patterns on a textured surface comprising a plurality of reliefs of amplitude greater than or equal to 100 nanometers, comprising:
    preparing a substrate during which whole of the textured surface of the substrate is made electrically conducting;
    coating during which at least one layer of an imprintable material is laid on the textured surface, made electrically conducting;
    pressing a mold comprising valleys or protrusions to transfer the valleys or the protrusions of the mold into the imprintable material to form patterns therein;
    removing the mold while leaving the imprint of the patterns in the imprintable material;
    exposing the textured surface at a bottom of the patterns;
    electrically depositing at least an electrically conducting or semiconducting material into the patterns to form conducting or semiconducting patterns;
    wherein the imprintable material is a photosensitive resist, wherein the mold comprises a masking coating at least partially stopping exposure of the resist that it selectively covers either outside the patterns only or on at least one of the patterns only, and further comprising exposing intended to activate the resist not masked by the masking coating, before the removing the mold.

18. A method according to claim 17, wherein the resist is a positive resist and the masking coating covers the mold outside an extremity of the patterns, or wherein the resist is a negative resist and the masking coating covers the mold at least on the extremity of the patterns.

19. A method according to claim 1, wherein during the coating, a volume of the layer of an imprintable material plated onto the textured surface is equal to $V_{layer}$, with $$V_{layer} = V_{mold} + V_{fill} + V_{safety}$$

with:
$V_{mold}$=the volume defined by the mold patterns,
$V_{fill}$=the free volume between the textured surface and a plane which is parallel to the substrate and goes through a highest point of the relief having greatest amplitude,
$V_{safety}$=(surface of the substrate)×(safety thickness), with the safety thickness being the distance between the peak of the highest relief of the textured surface and an extremity of the mold patterns.

20. A method according to claim 19, wherein the safety thickness $e_s$ is defined as follows:

$$(e_s) \leq 2H_m - (A)$$

with:
A=the distance between the highest point and the lowest point of the textured surface,
$H_m$=the height of the mold patterns.

21. A method according to claim 1, wherein if the aspect ratio of the reliefs of the textured surface is greater than or equal to 3, then the mold is set so that the width of the mold patterns is greater than the minimum width of the reliefs of the textured surface.

22. A method for producing at least one photovoltaic cell comprising a method according to claim 1.

* * * * *

UNITED STATES PATENT AND TRADEMARK OFFICE
CERTIFICATE OF CORRECTION

| | | |
|---|---|---|
| PATENT NO. | : 9,515,205 B2 | Page 1 of 1 |
| APPLICATION NO. | : 14/002854 | |
| DATED | : December 6, 2016 | |
| INVENTOR(S) | : Carole Pernel et al. | |

It is certified that error appears in the above-identified patent and that said Letters Patent is hereby corrected as shown below:

On the Title Page

Item (73), the Assignee's name is incorrect. Item (73) should read:
-- (73) Assignee: COMMISSARIAT A L'ENERGIE ATOMIQUE ET AUX ENERGIES ALTERNATIVES, Paris (FR) --

Signed and Sealed this
Third Day of April, 2018

Andrei Iancu
*Director of the United States Patent and Trademark Office*